United States Patent [19]

Coissard et al.

[11] Patent Number: 4,563,806
[45] Date of Patent: Jan. 14, 1986

[54] METHOD FOR THE MANUFACTURE OF A DISPLAY SCREEN BASED ON THIN-FILM TRANSISTORS AND CAPACITORS

[76] Inventors: Pierre Coissard, 31 residence Corlay; Joseph Richard, 33 Lotissement Keranroux; Francois Morin, le Carpont-Lanmerin, all of 22300 Lannion, France

[21] Appl. No.: 610,490
[22] PCT Filed: Sep. 12, 1983
[86] PCT No.: PCT/FR83/00177
 § 371 Date: May 7, 1984
 § 102(e) Date: May 7, 1984
[87] PCT Pub. No.: WO84/01239
 PCT Pub. Date: Mar. 29, 1984

[30] Foreign Application Priority Data

Sep. 14, 1982 [FR] France .............................. 82 15499

[51] Int. Cl.[4] .......................................... H01L 21/203
[52] U.S. Cl. .................................. 29/571; 29/577 C; 29/578; 29/580
[58] Field of Search ...................... 29/571, 577 C, 580, 29/578

[56] References Cited

U.S. PATENT DOCUMENTS

| | | | |
|---|---|---|---|
| 4,024,626 | 5/1977 | Leupp et al. | 29/571 |
| 4,167,806 | 9/1979 | Kumurdjian | 29/580 |
| 4,188,095 | 2/1980 | Nishimura et al. | 29/580 X |
| 4,332,075 | 6/1982 | Ota et al. | 29/571 |
| 4,366,614 | 1/1983 | Kumurdjian | 29/580 |

FOREIGN PATENT DOCUMENTS 0051396 5/1982 European Pat. Off. .
0082783 6/1983 European Pat. Off. .
2077994 12/1981 United Kingdom .

OTHER PUBLICATIONS

Gallagher, *Electronics International*, vol. 55, No. 10, May 1982, N.Y., pp. 94, 96.

*Primary Examiner*—George T. Ozaki
*Attorney, Agent, or Firm*—Oblon, Fisher, Spivak, McClelland & Maier

[57] ABSTRACT

Method for the manufacture of electronic circuits based on thin-film transistors and capacitors.

According to the invention this method comprises the following operations: deposition of a layer (102) of a first transparent, conductive material on an insulating substrate (100), first photogravure applied to the first layer to constitute blocks (106) forming one of the plates of the future capacitors, as well as the sources and drains for the future transistors, deposition of a hydrogenated, amorphous silicon layer (110), deposition of an insulating layer (112), deposition of a layer (114) of a second conductive material and second photogravure applied to the silicon layer-insulating layer-conductive layer assembly in order to define the control grids of the transistors.

Application to the construction of display screen control circuits or BBD registers.

2 Claims, 14 Drawing Figures

METHOD FOR THE MANUFACTURE OF A DISPLAY SCREEN BASED ON THIN-FILM TRANSISTORS AND CAPACITORS

BACKGROUND OF THE INVENTION

The present invention relates to a method for the manufacture of an active matrix display screen, based on thin-film transistors (TFT) and capacitors).It is used more particulary in the construction of liquid crystal display circuits.

TFT circuits are mainly used in the manufacture of active matrix display screens. In this type of screen, an electronic memory formed from memory points distributed over the entire surface of the screen, stores the video signal throughout the duration of the picture. The electrooptical transducer (e.g. a liquid crystal) is in contact with each memory point and is excited throughout the duration of a picture whereas in system without an electronic memory, the transducer is only excited for the duration of one row. The optical effect and the permitted multiplexing level are consequently much greater.

The TFT makes it possible to produce such an electronic memory on a glass substrate. Each memory point is located at the intersection of a connection column and a row and is constituted by a transistor and a capacitor. In the case where the transducer is a liquid crystal, the plates of the capacitor can be constituted by the electrodes of the actual liquid crystal cell. Thus, the memory point amounts to a TFT and a capacitor, whereof one of the plates is constituted by the electrode arranged on the wall of the cell containing the TFT, the other plate being formed by the counter-electrode arranged on the other wall of the cell.

Such a structure is shown in FIG. 1, where it is possible to see on the one hand a lower wall 10 carrying the conductive columns 12 and conductive rows 14, a TFT 20 and a transparent electrode 22, and on the other hand an upper wall 24 covered by an also transparent counter-electrode 26.

Besides active matrixes, other circuits can be produced with TFT's and, e.g., all or part of shift registers. Such circuits can be used in the low speed vertical register permitting the row-by-row switching of the display screen.

Methods for the manufacture of circuits based on TFT's and capacitors are already known. FIG. 2 (a, b) illustrates a procedure described by A. J. SNELL et al. in an article entitled "Application of amorphous silicon field effect transistors in addressable liquid crystal display panels" published in "Applied Physics", 24, pp. 357-362, 1981. The TFT is formed by a chromium grid G deposited on an insulating substrate 30, a silicon nitride ($Si_3N_4$) insulating layer 32, an amorphous silicon layer 34 (aSi), an aluminium source S and a drain D. The lower capacitor plate is formed from an indium - tin oxide layer 38. The connection between the TFT and the plate is by a drain D extended by a tab 40 following a contact hole 42 made in insulating layer 32. The complete circuit is constituted by a plurality of such structures arranged in matrix form. The grids G are constituted by connection rows 44 and the sources by columns 46.

The process for producing such a structure involves five masking levels:
the first for etching the conductive layer 38,
the second for etching grids G and etching rows 44,
the third for opening the windows 42 in insulant 32,
the fourth for etching semiconductor 34, and
the fifth for etching the source - drain contacts.

Such a process suffers from two disadvantages. Firstly a number of masking operations are required. It then necessitates the etching of the sources and the drains being selective and non-polluting with respect to the amorphous silicon, which must be protected by an adequate passivation, which must not produce an accumulation zone on the upper interface.

Another procedure for producing TFT's is known, in which unlike in the first-mentioned process, the TFT has its source and drain contacts in the lower part and its grid in the upper part. This procedure is described by M. MATSUMURA et al. in the article entitled "Amorphous silicon integrated circuit, published in "Proceedings of the IEE", vol. 68, No. 10, October 1980, pp. 1349-1350 and is illustrated by FIG. 3. On to a glass support 50 is deposited an amorphous silicon layer 52, followed by a n+ doped silicon layer, which is then etched to form the source contact 54 and drain contact 56. An insulating silica layer 58 is deposited on the entity. Openings 60, 62 are formed in the insulating layer to give access to the source and drain, whilst an aluminium layer forms the grid 64. The capacitor plate is formed by a transparent, conductive oxide layer 66, covered with a silica layer 58. An opening 68 is made in said layer and a connection 70 connects source 54 to electrode 66.

Such a structure requires the following six masking levels:
the first for etching the transparent electrode 66,
the second for etching the aSi layer 52, the third for etching the S contacts 54 and 56,
the fourth for opening windows 60, 62 in insulant 58,
the fifth for etching the drain and source metal coatings, and
the sixth for etching the grid metal coatings.

Thus, such a procedure is very complex.

SUMMARY OF THE INVENTION

The object of the present invention is to obviate these disadvantges by reducing the number of masking levels from 5 or 6 to two. As a result of the invention, better manufacturing efficiency levels are obtained the the production rate of the circuit is increased. Moreover, the method of the present invention does not necessarily assume that the silicon is deposited by high temperature CVD-plasma and other procedures are possible, particularly those operating at a lower temperature (250°-300° C.).

According to the invention, these objectives are achieved by a method essentially comprising the following operations:
deposition of an insulating substrate of a first transparent, conductive material,
first photogravure aplied to the first layer to form blocks forming one of the two plates of the future capacitors,
as well as sources and drains for the future transistors,
deposition of a hydrogenated, amorphous silicon layer,
deposition of an insulating layer, deposition of a layer of a second conductive material, and
second photogravure applied to the silicon layer - insulating layer - conductive layer assembly in order to define control grids for the transistors.

BRIEF DESCRIPTION OF THE DRAWINGS

The invention is described in greater detail hereinafter relative to non-limitative embodiments and with reference to the drawings following the already described FIGS. 1, 2a, 2b and 3 and wherein show.

DETAILED DESCRIPTION OF THE PREFERRED EMBODIMENTS

Figure 1:
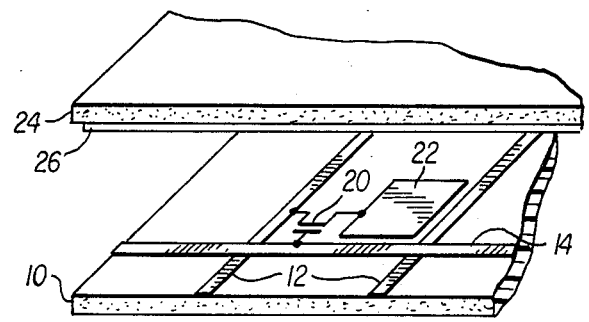
Figure 2A:
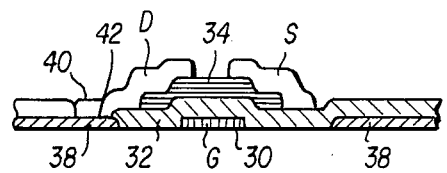
Figure 2B:
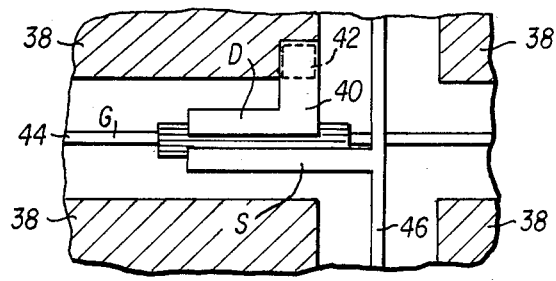
Figure 3:
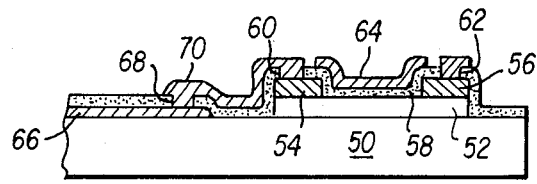

The various operations involved in the method according to the invention relating to the construction of the lower wall equipped with TFT's and one of the plates of the capacitors can be gathered from FIG. 4, showing the various intermediate stages of the circuit obtained. These operations are as follows:

- Operation 1: preparation of a glass substrate 100, e.g. according to Corning trademark 7059, by physicochemical cleaning.
- Operation 2: deposition of a transparent, conductive material layer 102, e.g. of tin and indium oxide (a).
- Operation 3: first photogravure to give the layer 102 the form of columns 104 and blocks 106 provided with a rectangular projection 108 (b).
- Operations 4, 5, 6: deposition of a hydrogenated, amorphous silicon layer 110, a silica layer 112, and an aluminium layer 114, each deposition taking place at approximately 250° C. (or higher) when using the TFT-plasma process (c).
- Operation 7: second photogravure for defining the rows 116 overlapping the projections 108 and defining the TFT's (d), the structure viewed in section along a row is shown in FIG. (e) and viewed in section across a block 106 in FIG. (f).
- Operation 8: general passivation by depositing an SiO$_2$ layer 116(g).

Figure 5:
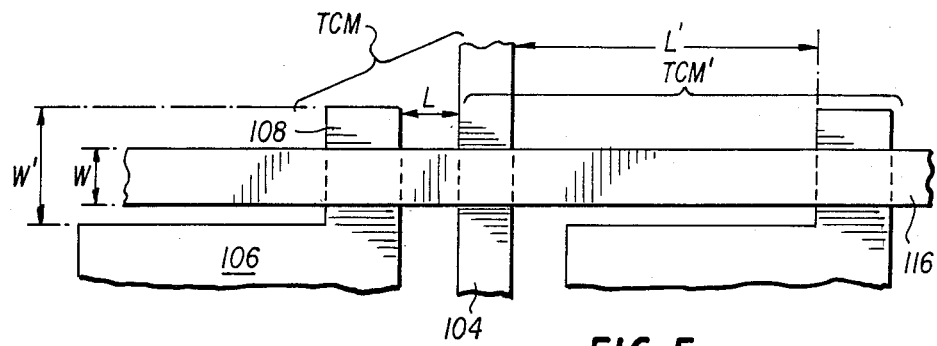
FIG. 5 a detail of the TFT obtained.

FIG. 5 shows on a large scale, the construction of the TFT in the overlap area between a row 116 and a column 104. The source and drain are respectively constituted by projection 108 and that part of column 104 located beneath row 116. The control grid is constituted by that part of row 116 located between projection 108 and column 104. Thus, in such a structure, there is necessarily a parasitic TFT' transistor located on the other side of column 104. However, the distance L' between the drain and the source of this transistor is considerable, so that the aSiH layer behaves as an insulant, due to its high resistivity. Conversely, for the TFT transistor, a channel defined by projection 108 and column 104 is short and has a very limited length L (approximately 10 μm), which makes it possible to obtain the required field effect. The aSiH layer located above the capacitor plate 106 can be looked upon as a supplementary dielectric layer.

It should also be noted that if the height W' of projection 108 significantly exceeds the width W of the rows 116 defining the control grids, there is a relatively large tolerance on the position to be given to these rows. Thus, the second mask can be positioned, with respect to the first, with a margin of error permitting the performance of an automatic alignment. This greatly simplifies the method according to the invention.

Figure 6:
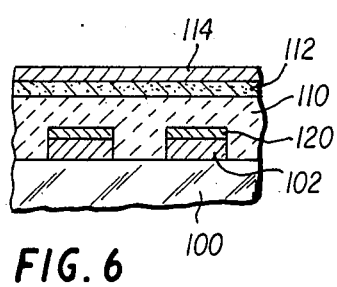
FIG. 6(a,b) a variant of the method in question.
Figure 6:
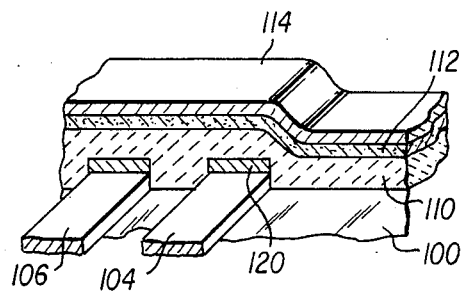
Figure 4A:
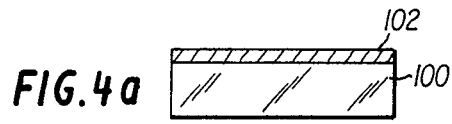
FIG. 4(a–g) various stages of the method according to the invention applied to the manufacture of liquid crystal display screens.
Figure 4B:
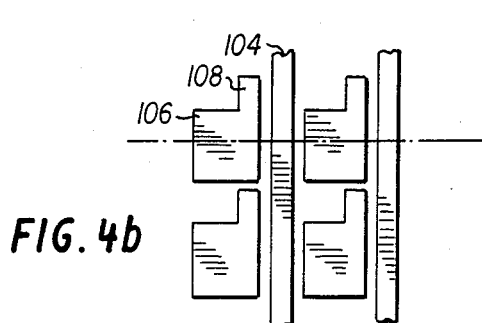
Figure 4C:
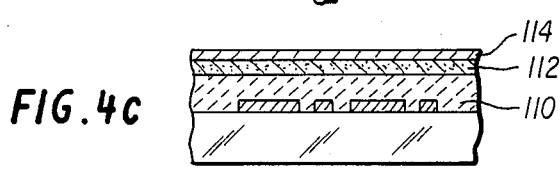
Figure 4D:
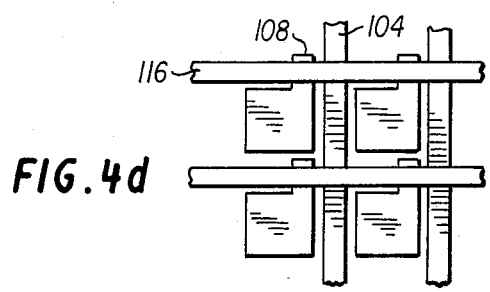
Figure 4E:
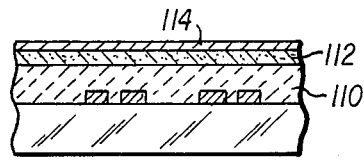
Figure 4F:
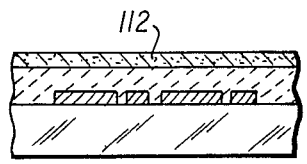
Figure 4G:
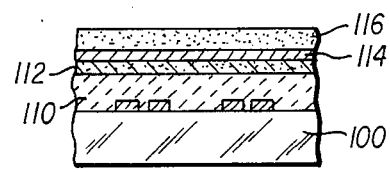

If it is wished to improve the contact between oxide 102 and the aSiH layer 110, it is possible to deposit, after the oxide, a highly n doped amorphous silicon layer (e.g. by adding PH$_3$ to the SiH$_4$ at the time of deposition). This is illustrated by FIG. 6, where this layer carries the reference 120. The etching of the first level is carried out with the aid of the same mask and this etching then affects the doped silicon layer 120 and the oxide layer 102, the other operations being identical. During the second etching of the structure, the doped silicon is etched following the semiconductor silicon. Thus, the doped silicon only persists underneath the grid and above the oxide (FIG. 6b).

We claim:

1. Method for the manufacture of an active matrix display screen formed from points constituted in each case by a thin file transistor and a capacitor, said method comprising the formation of a lower wall (10) carrying the first plates of the capacitors and thin-film transistors and an upper wall (24) covered with a counter-electrode (26) forming the second plates of the capacitors, characterized in that for forming the lower wall, the following operations are used:
    - deposition of a layer (102) of a first transparent, conductive material on an insulating substrate (100),
    - first photogravure applied to this first layer to constitute the rows and columns of blocks (106) forming one of the plates of the future capacitors, each block being connected to a projection (108), said first photogravure also leaving columns (104) of the first conductive material, said columns being positioned between the block columns,
    - deposition of a hydrogenated, amorphous silicon layer (11) on the entity,
    - deposition of an insulating layer (112),
    - deposition of a layer (114) of a second conductive material, and
    - second photogravure applied to the silicon layer - insulating layer - conductive layer assembly, said second photogravure leaving behind the rows (116) of the second conductive material, said rows passing above the projections (108), the overlap areas of a row (116) with a column (104) and a projection (108) defining the source and drain of a transistor, the grid of said transistor being constituted by that part of the row (116) located between the projection (108) and the column (104).

2. Method according to claim 1, characterized in that following the first deposition operation of the lower (102) of the first conductive material, and after the first photogravure, a highly n doped silicon layer (120) is deposited, the first photogravure affecting both said doped silicon layer (120) and the layer (102) of the first conductive material, the other operations remaining identical.

* * * * *